US010243570B1

(12) United States Patent
Forey et al.

(10) Patent No.: US 10,243,570 B1
(45) Date of Patent: Mar. 26, 2019

(54) CHARGE PUMP CIRCUITS FOR CLOCK AND DATA RECOVERY

(71) Applicant: INPHI CORPORATION, Santa Clara, CA (US)

(72) Inventors: Simon Forey, Northamptonshire (GB); Parmanand Mishra, Cupertino, CA (US); Michael Harwood, Rushden (GB); Rajasekhar Nagulapalli, Northamptonshire (GB)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/663,419

(22) Filed: Jul. 28, 2017

(51) Int. Cl.
H03L 7/06 (2006.01)
H03L 7/08 (2006.01)
H03L 7/07 (2006.01)
H03L 7/081 (2006.01)
H03L 7/099 (2006.01)
H03L 7/187 (2006.01)
H03K 5/135 (2006.01)

(52) U.S. Cl.
CPC .......... *H03L 7/0802* (2013.01); *H03K 5/135* (2013.01); *H03L 7/07* (2013.01); *H03L 7/0814* (2013.01); *H03L 7/0995* (2013.01); *H03L 7/187* (2013.01)

(58) Field of Classification Search
CPC ....... H03L 7/0802; H03L 7/07; H03L 7/0995; H03L 7/187; H03K 5/135
USPC ................... 327/534–538, 147–160
See application file for complete search history.

(56) References Cited

U.S. PATENT DOCUMENTS

| 7,342,521 | B1* | 3/2008 | Liu ........................... H03L 7/07 341/100 |
| 9,742,551 | B2* | 8/2017 | Forey ..................... H04L 7/0331 |
| 2008/0130810 | A1* | 6/2008 | Bae ........................ H04L 7/0337 375/355 |
| 2016/0336923 | A1* | 11/2016 | Seedher ................ H03L 7/0891 |

* cited by examiner

*Primary Examiner* — Dinh T Le
(74) *Attorney, Agent, or Firm* — Richard T. Ogawa; Ogawa P.C.

(57) ABSTRACT

The present invention is directed to electrical circuits. More specifically, embodiments of the present invention provide a charge pump, which can be utilized as a part of a clock data recovery device. Early and late signals are used as differential switching voltage signals in the charge pump. The first switch and a second switch are used for controlling the direction of the current flowing into the loop filter. Input differential voltages to the switches are being generated with an opamp negative feedback loop. The output voltage of the first switch and the second switch is used in conjunction with a resistor to generate a charge pump current. There are other embodiments as well.

10 Claims, 7 Drawing Sheets

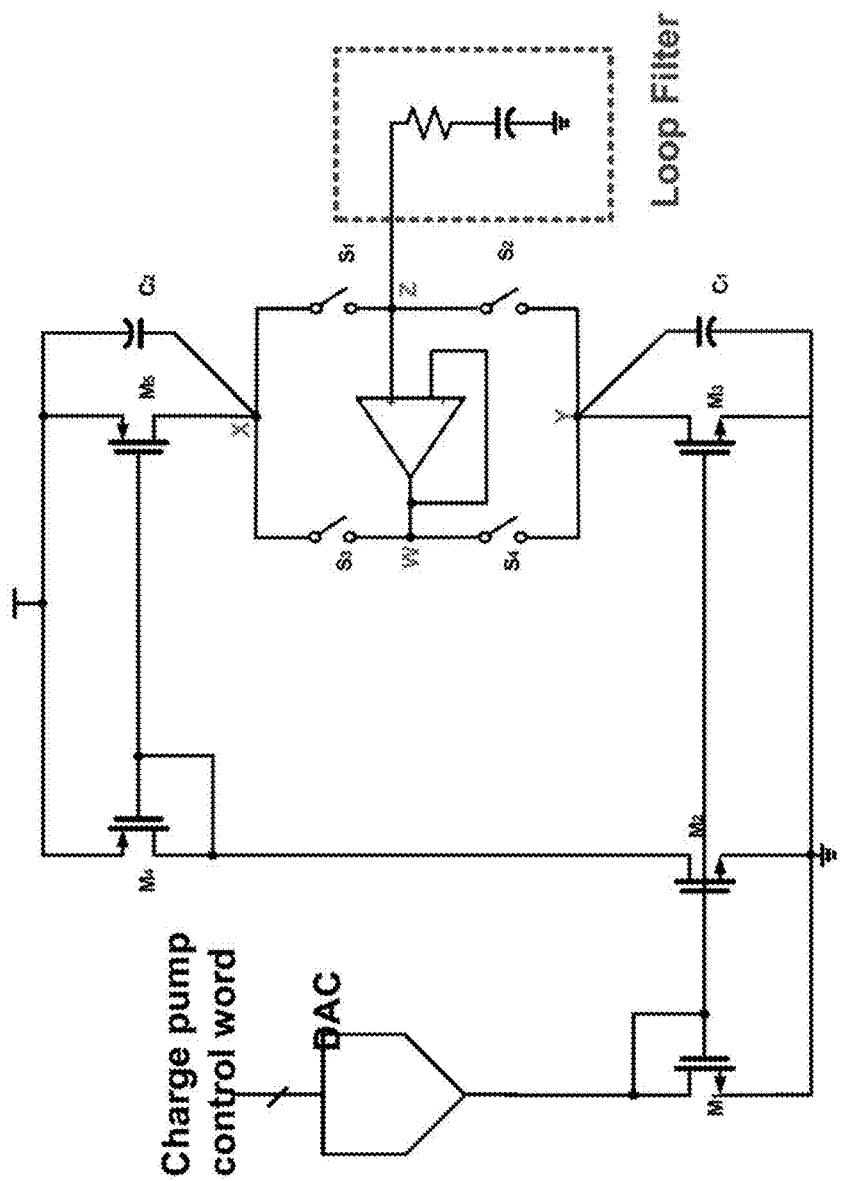
Figure 3
(Conventional)

CHARGE PUMP CIRCUITS FOR CLOCK AND DATA RECOVERY

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to electrical circuits.

Over the last few decades, the use of communication networks exploded. In the early days of the Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs. For high-data communication applications, serializer/deserializer ("SERDES" or "SerDes") with clock and data recovery (CDR) modules are often used.

Over the past, there have been many types of communication systems and methods. Unfortunately, they have been inadequate for various applications. More specifically, existing CDR devices are often inadequate in various applications. Therefore, improved systems and methods are desired.

BRIEF SUMMARY OF THE INVENTION

The present invention is directed to electrical circuits. More specifically, embodiments of the present invention provide a charge pump, which can be utilized as a part of a clock data recovery device. Early and late signals are used as differential input control signals in the charge pump. A first switch and a second switch are used for controlling the direction of the charge pump current. The output voltage of the first switch and the second switch is used in conjunction with a resistor to generate a charge pump current. There are other embodiments as well.

According to an embodiment, the present invention provides a clock data recovery device. The device includes a data sampler for performing data sampling on received data signals and generating a clock signal. The data sampler is configured to adjust the data clock signal using a loop filter and a voltage controlled oscillator (VCO). The device also includes an edge sampler for performing sampling on the received data signals during transition and generating an edge clock signal. The device further includes a phase detector configured to generate an early and a late signal using the data clock signal and the edge clock signal. The device additionally includes a charge pump module comprising a first switch and a second switch and an output resistor. The charge pump module is configured to provide a pair of differential voltages. The pair of differential voltages includes a first voltage based on the late signal and coupled to the first switch. The pair of differential voltages also includes a second voltage based on the early signal and coupled to the second switch. The output resistors are configured to output a charge pump current based on the pair of differential voltages. The device also includes a loop filter being configured to generate the offset signal based on the charge pump current.

According to another embodiment, the present invention provides a SerDes apparatus. The apparatus includes an input terminal for processing an input data stream. The apparatus also includes an equalizer module configured to generate an equalized data stream based on the input data stream. The apparatus additionally includes a variable gain amplifier configured to generate an amplified data stream based on the equalized data stream. The apparatus further includes a clock data recover (CDR) device configured to generate a clock signal using the input data stream. The CDR device has a phase detector, charge pump, loop filter and a VCO. The phase detector is configured to generate an early signal and a late signal based on the data stream. The charge pump has a first switch and a second switch. The first switch is coupled to a first differential voltage based on the late signal. The second switch is coupled to a second differential voltage based on the early signal. The charge pump is configured to generate an offset signal for adjusting the clock signal using a charge pump current based on the first differential voltage and the second differential voltage.

According to yet another embodiment, the present invention provides a charge pump circuit device. The device includes an input transistor for receiving an input signal. The device also includes a first transistor configured to generate a first differential voltage based on the input signal. The first transistor includes a first gate terminal and a first output terminal. The device also includes a first resistor and a second resistor coupled to a first output terminal. The device includes an operational amplifier comprising a first input terminal and a second output terminal. The second output terminal is coupled to the first output terminal via the first resistor. The device also includes a first switch coupled to the first output terminal via the second resistor. The first switch is turned on by a late signal. The device includes a second transistor comprising a second gate terminal and a third output terminal. The second gate terminal is coupled to the second output terminal. The device additionally includes a third resistor coupled to the third output terminal. The device further includes a second switch coupled to the third output terminal via the third resistor. The second switch is turned on by an early signal. The device also includes a fourth resistor coupled to the first switch and a second switch. The fourth resistor is associated with a charge pump current.

It is to be appreciated that embodiments of the present invention provide many advantages over conventional techniques. Compared to existing designs, charge pump devices according to embodiments of the present invention reduce the amount of charge glitches by using differential voltages as input signals. Additionally, charge pump devices according to embodiments of the present invention are less susceptible to parasitic effects of capacitors.

Embodiments of the present invention can be implemented in conjunction with existing systems and processes. For example, charge pump devices according to embodiments of the present invention can be manufactured using existing manufacturing processes, and they can be incorporated into various types of CDR designs.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 3 is a diagram illustrating a conventional charge pump architecture for clock and data recovery (CDR).

DETAILED DESCRIPTION OF THE INVENTION

The present invention is directed to electrical circuits. More specifically, embodiments of the present invention provide a charge pump, which can be utilized as a part of a clock data recovery device. Early and late signals are used as differential input control signals in the charge pump. A first switch and a second switch are used for controlling the direction of the charge pump current. The output voltage of the first switch and the second switch is used in conjunction with a resistor to generate a charge pump current. There are other embodiments as well.

Figure 1:
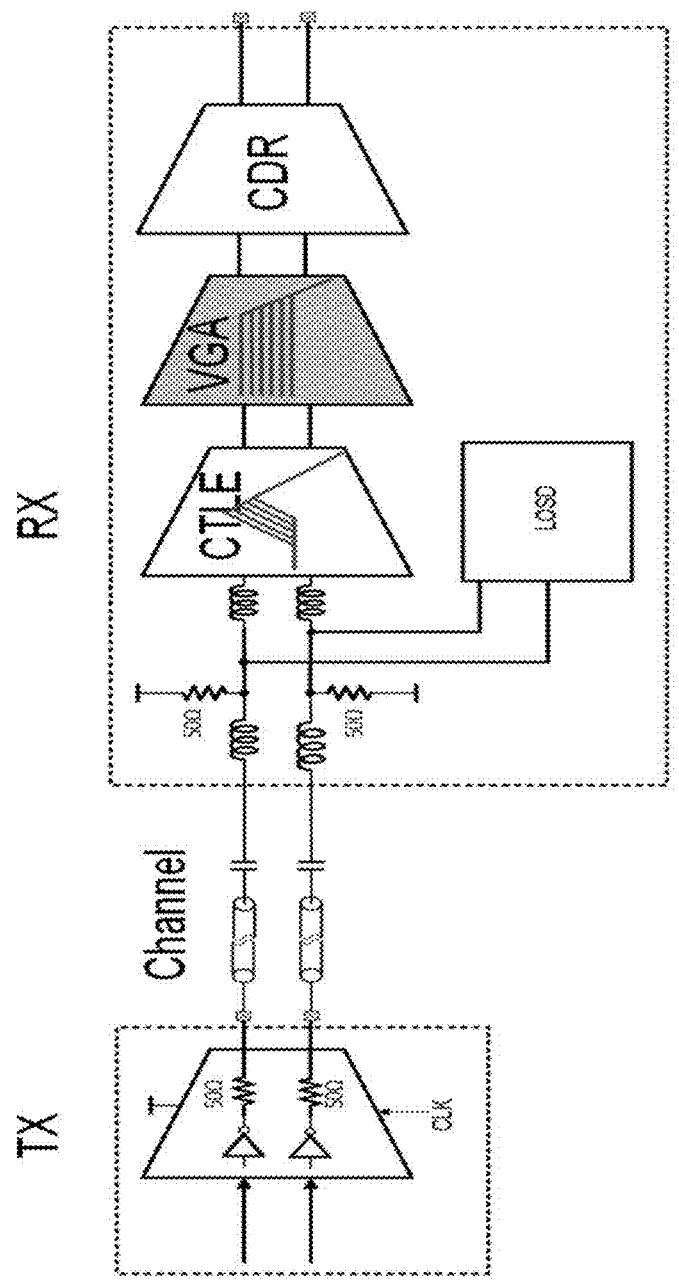
FIG. 1 is a simplified block diagram illustrating a communication system according to embodiments of the present invention.

FIG. 1 is a simplified block diagram illustrating a communication system according to embodiments of the present invention. This diagram is merely an example, which should not unduly limit the scope of the claims. One of ordinary skill in the art would recognize many variations, alternatives, and modifications. In FIG. 1, the transmitter (TX) transits data signal, as a differential signal, to the receiver (RX) via a pair of communication channels. For example, the transmitter and the receiver are implemented as parts of for SerDes systems. At the receiver, the input signals are received at the input terminals with inductive coils and termination resistors that improves the signal integrity. The CTLE module is implemented as a part of the receiver. Input signals are equalized by the CTLE before further processing. For example, loss of signal detection (LOSD) module determines whether there is signal being received. Once it is determined that there are signal coming from the transmitting entity (TX), equalization is performed by the CTLE module. On the other hand, if the LOSD module fails to detect signal presence (or detecting a week signal), signal processing is not performed. For example, the CTLE module is used as a component of an analog front end portion of the communication device. The equalized signal, which is a differential pair, is then provided to the VGA as show. The VGA is specifically configured to amplify the received signal by a predetermined amount, and the VGA operates in conjunction with CLTE. It is to be appreciated that the use of CTLEs with VGAs takes advantage of the fact that CTLEs are essential front end circuit of the receiver devices. For example, receivers are generally implemented with CTLEs followed by one or more VGAs. For example, the VGA is configured to enable constant output voltage swing at the output for a different set of input signal swings by adjusting the gain control code.

As shown in FIG. 1, after equalization is performed by the CTLE module and adjusted by the VGA, signal processing such as clock data recovery (CDR), analog to digital conversion (ADC), and/or other processes are then performed. The CDR module is configured to determine a frequency for the incoming data and to phase-align the clock to the transition in the data stream. According to embodiments of the present invention, CDR modules include phase detectors that generate early/late signals, and based on the early/late signals, charge pumps inject control amounts of charge into a loop filter. It is to be appreciated that the receiver illustrated in FIG. 1 can be used in a variety of applications and systems. For example, the receiver can be a part of a transceiver device.

The following description is presented to enable one of ordinary skill in the art to make and use the invention and to incorporate it in the context of the particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 2:
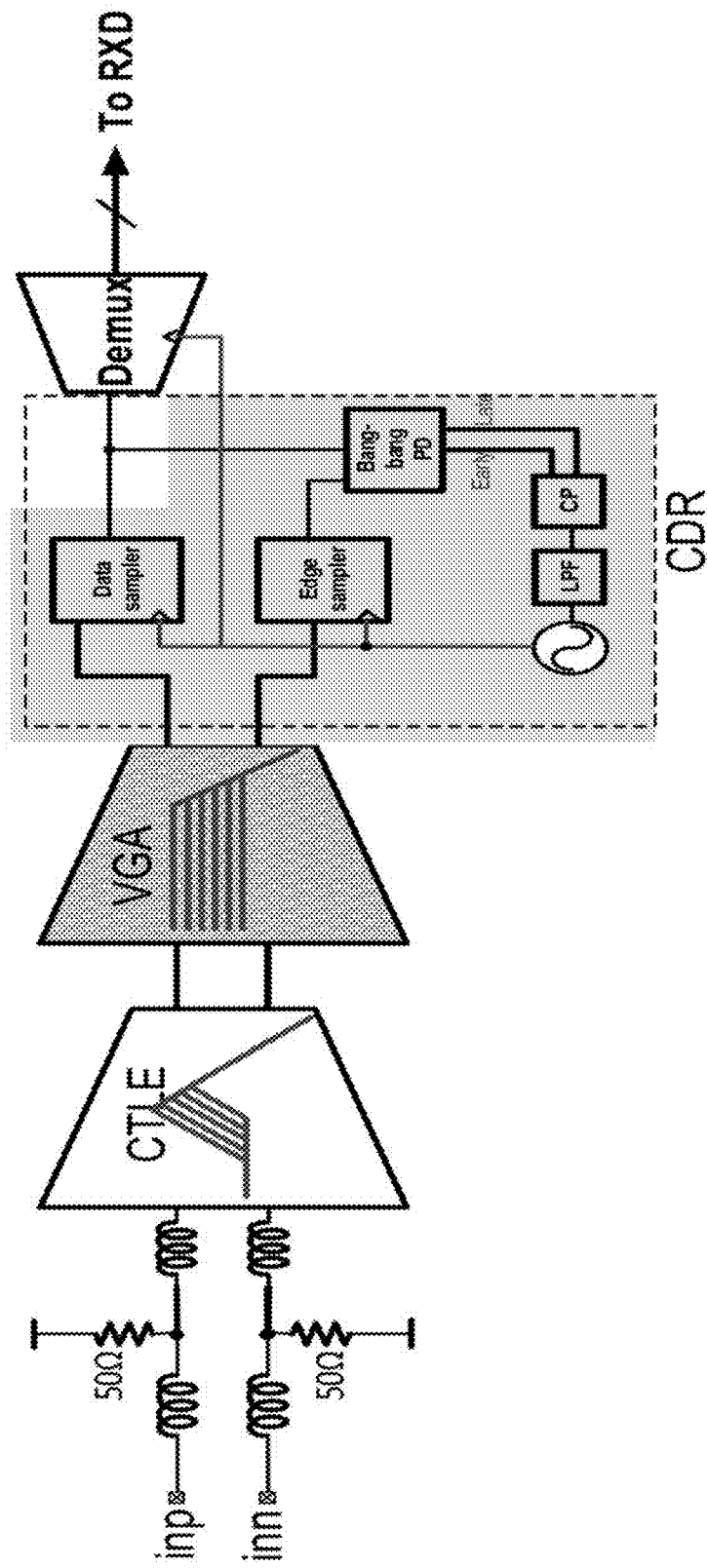
FIG. 2 is a simplified diagram illustrating a receiver apparatus according to embodiments of the present invention.

FIG. 2 is a simplified diagram illustrating a receiver apparatus according to embodiments of the present invention. This diagram is merely an example, which should not unduly limit the scope of the claims. One of ordinary skill in the art would recognize many variations, alternatives, and modifications. As shown in FIG. 2, the CDR module is configured between the variable gain amplifier and the de-multiplexer module. More specifically, the CDR module includes a data sampler and an edge sampler. Together, the data sampler and the edge sampler approximate the phase of the clock with respect to the data. In various embodiments, the data sampler and the edge sampler are implemented using sense-amplifier based regeneration flip-flops. Based on the output from the data sampler and the edge sampler, the bang-bang phase detector (and/or other types of phase detector) generates early/late signal, which is used for phase correction. The charge pump (CP) uses the early/late signal from the phase detector (PD) to generate and inject a controlled amount of charge into the loop filter (LPF), and the filtered signal is used to drive the VCO to the correct frequency and phase, the clock output from the VCO given to the data sampler and the edge sampler to provide phase correction. Additionally, the generated clock is provided to the de-multiplexer module as shown. It is important for the charge pump to generate the correct amount of charge for the purpose of phase correction. More specifically, the amount of charge should be the same in early/late phase. Mismatch or incorrect amount of charge would create undesirable phase offset between the clock edge and center of the data eye. As the Bang-Bang phase detector switches from early to late or late to early, the charge pump would introduce charge glitches. For good performance, it is desirable to minimize charge glitches relative to the actual charge generated by the charge pump. For example, charge glitches can be reducing by decreasing the parasitic capacitance on critical nodes.

FIG. 3 is a diagram illustrating a conventional charge pump architecture for clock and data recovery (CDR). The input signal for early/late indication is receive as a charge pump control word from the digital-to-analog converter (DAC). When late signal is high, switch $S_1$ and switch $S_4$ are closed and charge pump current (i.e., current from transistor $M_5$) is fed into the loop filter and charges the loop filter. When early signal is high switch $S_2$ and switch $S_3$ are turned on and charge pump current (i.e., current form transistor $M_3$) flow away from the loop filter and discharges the loop filter. The operation amplifier configured between the switches reduces the charge sharing between the node Z and W during current switching.

There are various drawbacks associated with conventional charge pump architecture illustrated in FIG. 3. Transistor $M_5$ and transistor $M_3$ are a matched pair, and their sizes depend on the mismatch requirement between currents. Generally, transistors $M_5$ and $M_3$ are bulky, and hence undesirable parasitic effect associated with nodes X and Y (i.e., respectively corresponding to capacitors $C_1$ and $C_2$) can be significant. During early/late switching, glitch current resulting from charging/discharging capacitors $C_1$ and $C_2$ can be high, and hence this architecture is not suitable for implementations such as low current charge pump. Additionally, charge pump noise depends on the transconductance of transistors $M_5$ and $M_3$, which may contribute to a significant portion of the overall CDR noise. A low noise architecture possible by relaying partially on noise less resisters and transistor currents. It is thus to be appreciated that in various embodiments, the present invention provides novel charge pump implementation used in CDR devices.

Figure 4:
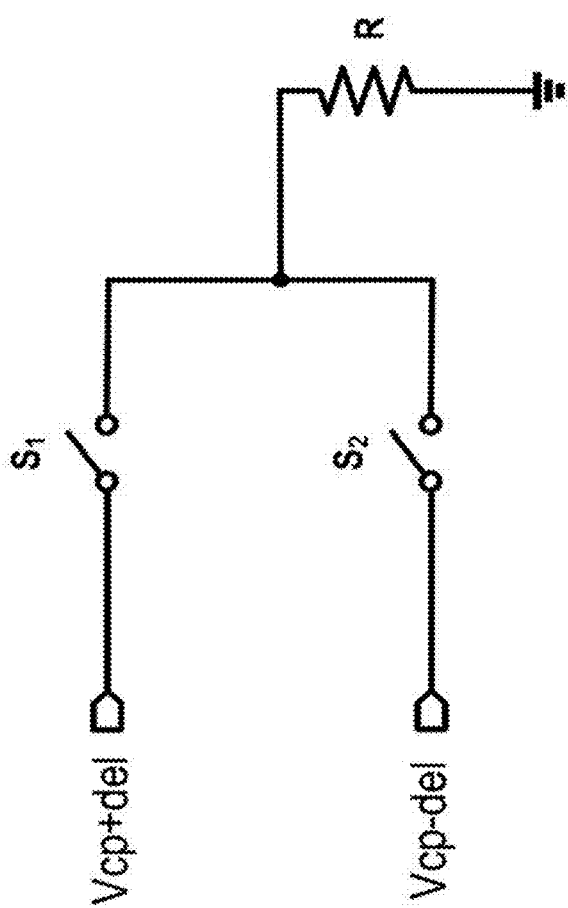
FIG. 4 is simplified diagram illustrating a switching mechanism used in exemplary charge pump implementations according to embodiments of the present invention.

FIG. 4 is simplified diagram illustrating a switching mechanism used in exemplary charge pump implementations according to embodiments of the present invention. This diagram is merely an example, which should not unduly limit the scope of the claims. One of ordinary skill in the art would recognize many variations, alternatives, and modifications. As shown in FIG. 4, differential voltages used in a charge pump are controlled by two switches. In contrast to the architecture illustrated in FIG. 3, which operates in a current mode, the switching mechanism (part of an exemplary charge pump described below) operates in a voltage mode. The inputs $V_{cp}$+del and $V_{cp}$−del are differential voltages respectively provided to switches $S_1$ and $S_2$. Resistor R is used to convert the differential voltages to currents. It is to be appreciated that the differential voltages, as provided to switches $S_1$ and $S_2$, are characterized by a low impedance, and the charging and discharging currents are generated using the resistor as shown. Switches $S_1$ and $S_2$ are respectively controlled by late and early signals. More specifically, the switch $S_1$ is controlled by a late signal. When switch $S_1$ is on, the current through the resister R would be $$\frac{V_{cp} + Del}{R},$$

and this current charges the loop filter. The switch $S_2$ is controlled by the early signal. When it is on, the current through the resister R will be $$\frac{V_{cp} - Del}{R},$$

and this current dis-charges the loop filter.

Figure 5:
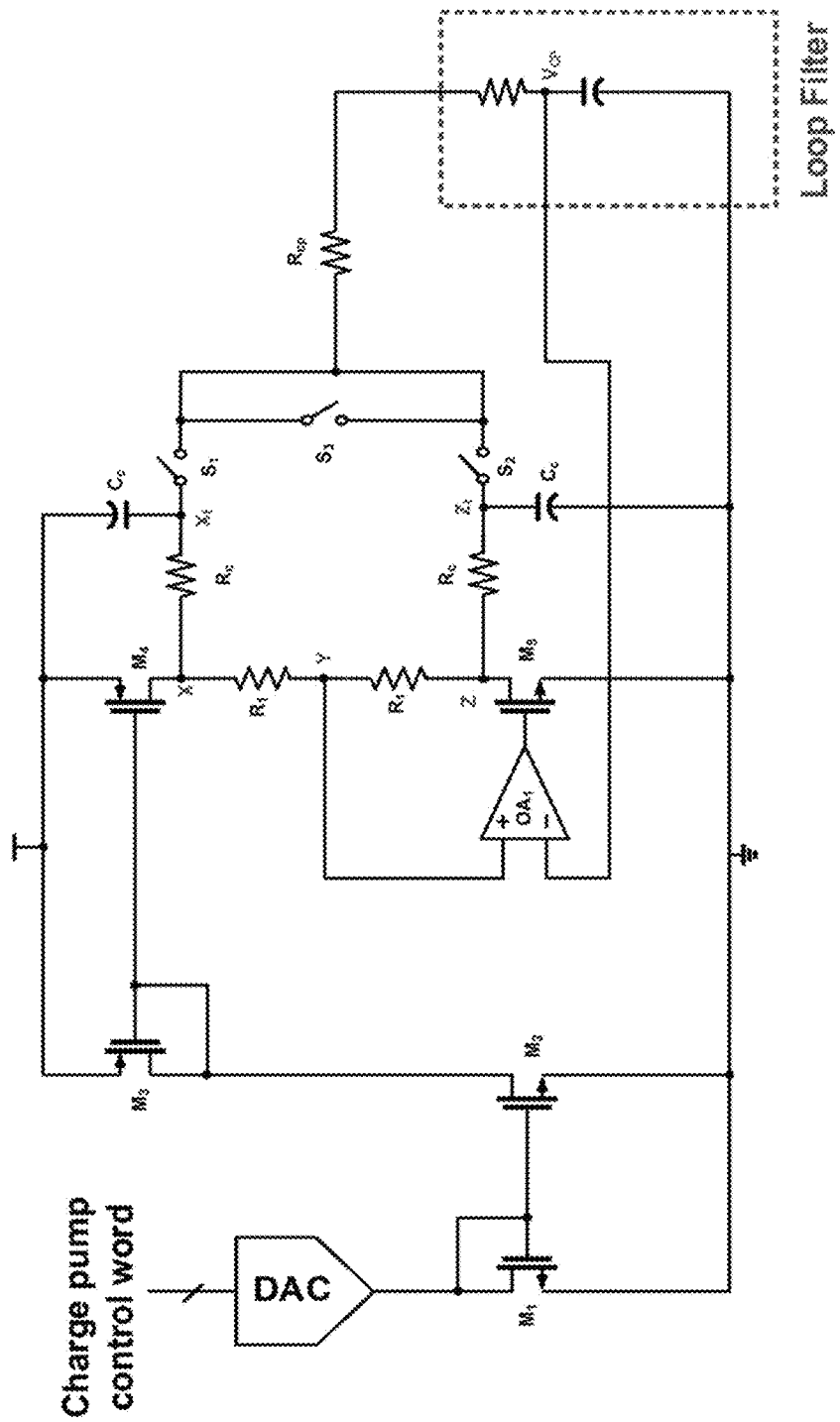
FIG. 5 is a simplified diagram illustrating a charge pump architecture according to embodiments of the present invention.

FIG. 5 is a simplified diagram illustrating a charge pump architecture according to embodiments of the present invention. This diagram is merely an example, which should not unduly limit the scope of the claims. One of ordinary skill in the art would recognize many variations, alternatives, and modifications. As shown in FIG. 5, charge pump control word (or control signal) is received from the DAC. For example, the phase detector generates early and late signals based on the phase obtained from the data sampler and the edge sampler, and the early/late signals are provided as control word generated by the DAC.

The charge pump control word is controlling the current given by the DAC, and processed by transistors $M_1$ and $M_2$. For example, transistors $M_1$ and $M_2$ as shown are implemented using NMOS transistors, but it is to be understood that other types of transistors can be used as well. The control signal propagates through transistors $M_3$ and $M_4$. As an example, transistors $M_3$ and $M_4$ can be implemented using NMOS transistors as shown, but it is to be understood that other types of transistors can be used as well. Transistor $M_4$ generates a reference current $I_{CP}$. The operational amplifier $OA_1$ adjusts the gate voltage of transistor $M_5$ until transistor $M_5$ current equals to the current at transistor $M_4$, and voltage at node Y equals to loop filter voltage $V_{cp}$. As explained above, voltage input to the switches $S_1$ and $S_2$ are differential voltages. That is, voltages at node X and node Z are pure differential around the common mode voltage of the loop filter. Voltage at node X is $V_x=V_{cp}+I_{cp}*R_1$. Voltage at node Z is $V_z=V_{cp}-I_{cp}*R_1$. The low pass filter formed by resistor $R_c$ and capacitor $C_c$ generates stable voltage reference at node $x_f, z_f$. For example, resistor $R_c$ and capacitor $C_c$ directly coupled to node $X_f$ form a low-pass resistor for switch $S_1$. Resistor $R_c$ and capacitor $C_c$ directly coupled to node $Z_f$ form a low-pass resistor for switch $S_2$. In various embodiments, resistors Rc respectively at $X_f$ node and $Z_f$ node are matched resistors with similar resistances. Similarly, capacitors $C_c$ respectively at $X_f$ node and $Z_f$ node are matched capacitors with similar capacitances. When late signal is high, switch $S_1$ is turned on (i.e., closed), and the current flowing through resistor $R_{cp}$ charges the loop filter. When early signal is high, switch $S_2$ is turned on, and current flowing through resistor $R_{cp}$ dis-charges the loop filter. It is to be appreciated the charge pump architecture illustrated in FIG. 5 offer many advantages over existing techniques. The current flowing into the loop filter is generated by the reference voltage (i.e., through switch $S_1$ or switch $S_2$) and the charge pump resistor $R_{cp}$. This charge pump current is substantially insensitive to glitches, especially at low current (e.g., 25 uA or lower).

The charge pump also includes switch $S_3$, which is configured between switch $S_1$ and switch $S_2$. Among other things, switch $S_3$ provides equalization between outputs of switch $S_1$ and switch $S_2$. In various embodiments, switches $S_3$ is coupled to a control signal provided by a control module (not shown).

Figure 6:
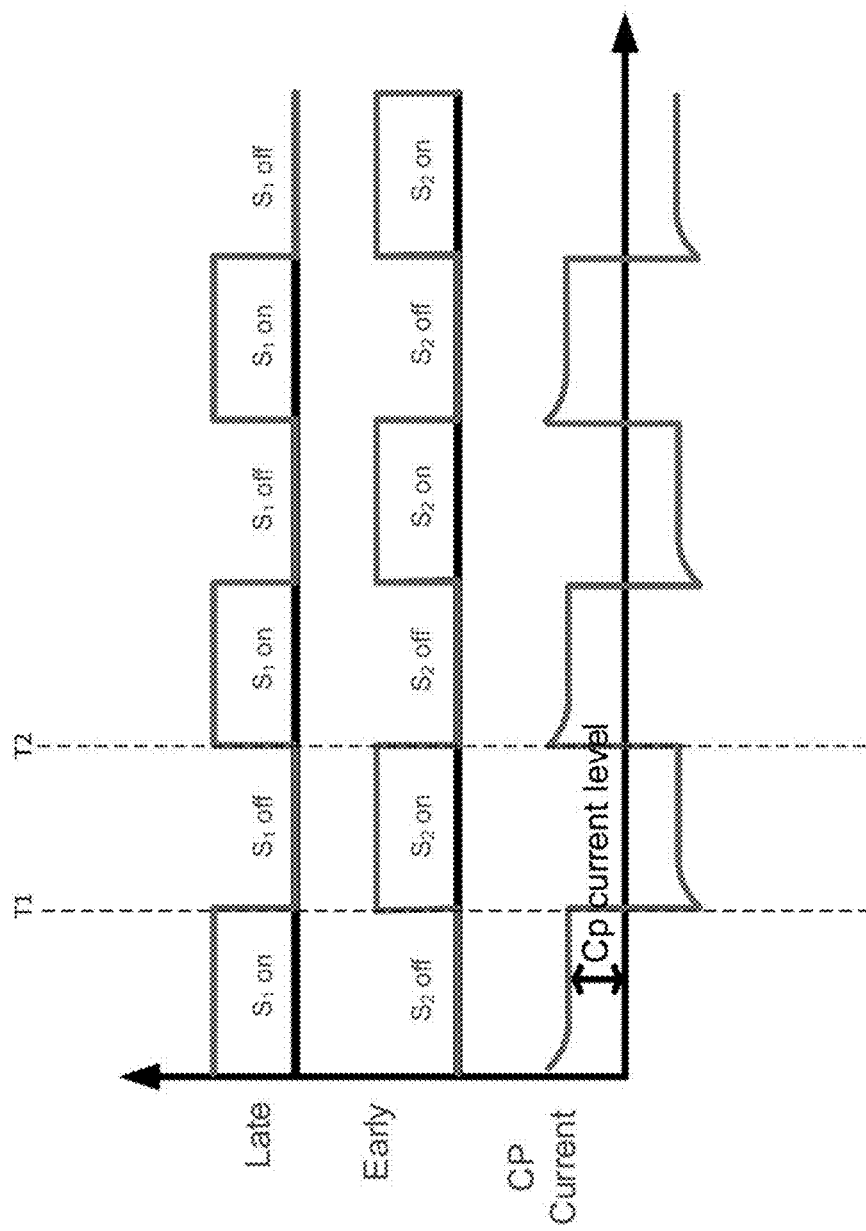
FIG. 6 is a timing diagram illustrating operation of the charge pump architecture according to embodiments of the present invention.

FIG. 6 is a timing diagram illustrating operation of the charge pump architecture according to embodiments of the present invention. This diagram is merely an example, which should not unduly limit the scope of the claims. One of ordinary skill in the art would recognize many variations, alternatives, and modifications. For example, the timing diagram corresponds to charge pump architecture illustrated in FIG. 5. In FIG. 6, switch $S_1$ corresponds to late signal, and switch $S_2$ corresponds to early signal. Switch $S_1$ and switch $S_2$ alternate, as do the late the early signal. The charge pump current $I_{cp}$ closely follow the operation of switches $S_1$ and $S_2$. When switch $S_1$ is on (and switch $S_2$ is off), charge pump current $I_{cp}$ is positive, which charges the loop filter. When switch $S_2$ is on (and switch $S_1$ is off), charge pump current $I_{cp}$ is negative, which discharges the loop filter. Switches control the direction of the current and charge pump control word decides the current magnitude. In various embodiments, the charge pump current levels for charging and discharging are tightly controlled and the amount of glitches is minimized. For example, at time T1, switch $S_1$ transitions from "on" to "off" and switches $S_2$ transitions from "off" to "on", and the charge pump current transitions from a positive current to a negative current. For example, the magnitudes of positive and negative charge pump currents are close. Similarly, at time T2, switch $S_1$ transitions from "off" to "on" and switches $S_2$ transitions from "on" to "off", and the charge pump current transitions from a negative current to a positive current. Again, the magnitudes of positive and negative charge pump currents are close. For example, the positive charge pump current before T1 and the negative charge pump current between T1 and T2 are characterized by substantially the same magnitude.

Figure 7:
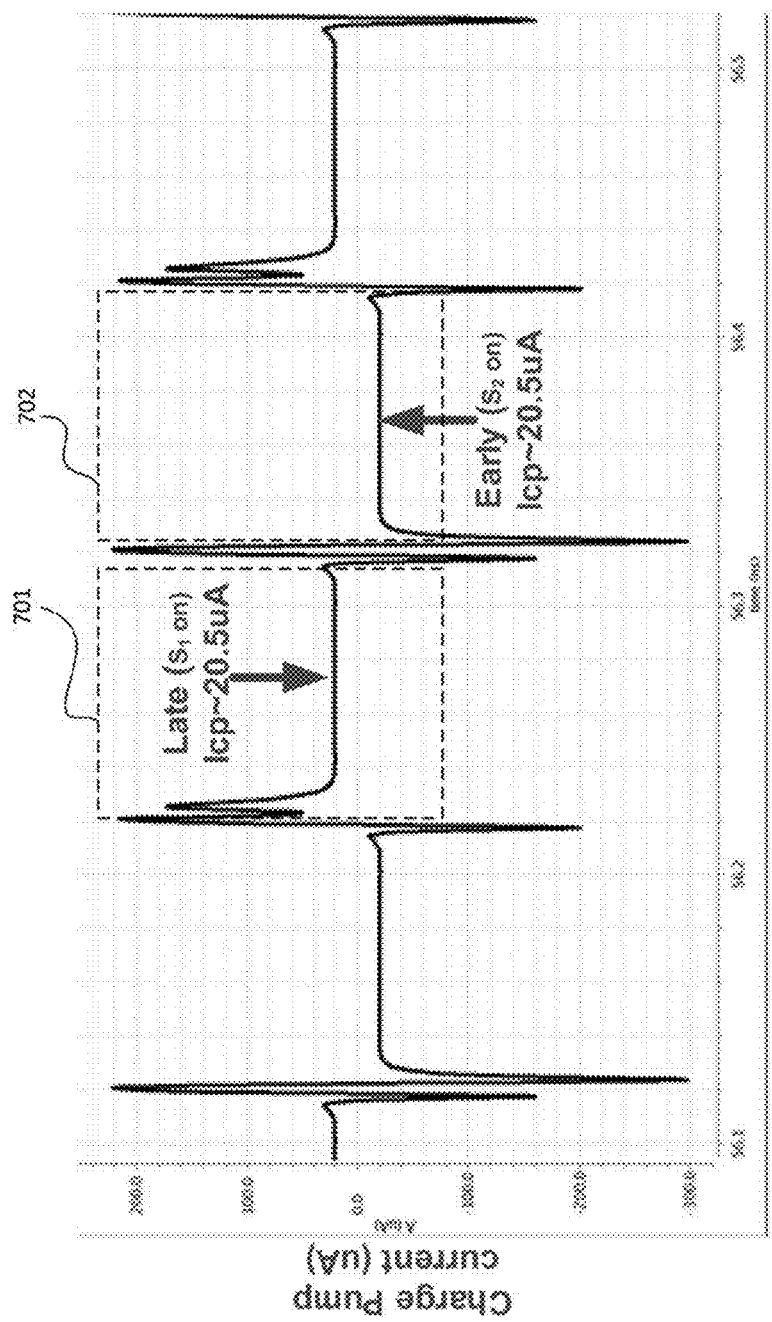
FIG. 7 is a graph illustrating simulation results for a charge pump architecture according to embodiments of the present invention.

FIG. 7 is a graph illustrating simulation results for a charge pump architecture according to embodiments of the present invention. For the late signal, the charge pump current $I_{cp}$ (e.g., at region 701) is positive with a magnitude of about 20.5 uA. For the early signal, the charge pump current $I_{cp}$ (e.g., at region 702) is negative with a magnitude of about 20.5 uA, which is substantially the same magnitude as the positive charge pump current. As shown in FIG. 7, charge pump currents for early and late signals can be maintained at stable and minimal glitch area, which allows for precise control and adjustment of CDR output clock phase.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A clock data recovery device comprising:
a data sampler for performing data sampling on received data signals and generating a data clock signal, the data sampler being configured to adjust the data clock signal using a loop filter voltage;
an edge sampler for performing sampling on the received data signals during the transitions and generating an edge clock signal;
a phase detector configured to generate an early and a late signal using the data clock signal and the edge clock signal;
a charge pump module comprising a first switch and a second switch and an output resistor, the charge pump module being configured to provide a pair of differential voltages, the pair of differential voltages including a first voltage based on the late signal and coupled to the first switch, the pair of differential voltages including a second voltage based on the early signal and coupled to the second switch, the output resistors being configured to output a charge pump current based on the pair of differential voltages, a first output of the first switch being directly coupled to a second output of the second switch; and
a loop filter being configured to generate the loop filter voltage based on the charge pump current.

2. The device of claim 1 wherein the charge pump further comprises a third switch for providing equalization between the first switch and the second switch.

3. The device of claim 1 wherein the edge sampler is configured to adjust the edge clock signal using at least the loop filter voltage.

4. The device of claim 1 wherein the phase detector comprises a bang-bang phase detector.

5. The device of claim 1 wherein the charge pump current has a magnitude of less than 40 uA.

6. The device of claim 1 wherein the first switch is coupled to a first capacitor, and the second switch is coupled to a second capacitor, the first capacitor and the second capacitor are a matched pair.

7. The device of claim 1 wherein the first switch is coupled to a first resistor, and the second switch is coupled to a second resistor, the first resistor and the second resistor are a matched pair.

8. The device of claim 1 wherein the charge pump further comprises an operational amplifier.

9. The device of claim 1 wherein the charge pump current is positive when the first switch is closed.

10. The device of claim 1 wherein the charge pump current is negative when the first switch is closed.

\* \* \* \* \*